United States Patent [19]
Bell

[11] Patent Number: 4,742,396
[45] Date of Patent: May 3, 1988

[54] CHARGE COUPLED DEVICE IMAGE SENSORS

[75] Inventor: Raymond T. Bell, Stanmore, England

[73] Assignee: The General Electric Company, p.l.c., England

[21] Appl. No.: 877,191

[22] Filed: Jun. 23, 1986

[30] Foreign Application Priority Data

Jul. 17, 1985 [GB] United Kingdom ............... 8518067

[51] Int. Cl.⁴ ............................................. H04N 3/14
[52] U.S. Cl. ........................... 358/213.24; 358/213.25
[58] Field of Search .................. 358/221, 212, 213.24, 358/213.15, 213.16, 213.19

[56] References Cited

U.S. PATENT DOCUMENTS 4,496,982 1/1985 Levine ................................. 358/213
4,567,524 1/1986 Levine ................................. 358/213

Primary Examiner—Jin F. Ng
Assistant Examiner—Stephen Brinich
Attorney, Agent, or Firm—Kirschstein, Kirschstein, Ottinger & Israel

[57] ABSTRACT

In a frame transfer CCD image sensor the number of charge storage locations per channel (25) in the store section (35A, B) is greater than in the image section (33). Frame transfer is effected so that after each frame transfer the image charge pattern in the image section is transferred to the store section so as to leave at least one line of charge storage locations (35B) in the store section between the image section and the charge pattern transferred to the store section which contains charge resulting only from frame shift smear and is otherwise empty of charge. Electrical circuitry (41 to 57) is provided to subtract electrical signals representing charges in the line or lines containing frame shift smear charge only from electrical signals representing the image charge pattern, thereby to cancel frame shift smear in the signals representing the image charge pattern.

3 Claims, 2 Drawing Sheets

CHARGE COUPLED DEVICE IMAGE SENSORS

BACKGROUND OF THE INVENTION

1. Field of the Invention

This invention relates to charge coupled device (CCD) image sensors.

More particularly the invention relates to CCD image sensors of frame transfer format.

2. Description of Related Art

A frame transfer CCD image sensor of conventional form will now be described with reference to FIGS. 1, 2 and 3 of the accompanying drawings which are diagrams illustrating the sensor and its operation.

Referring to FIG. 1, the sensor includes an array 1 of similar semiconductor electric charge storage and transfer channels formed on a substrate and arranged side by side, the channels extending in the vertical direction in FIG. 1.

Referring now to FIG. 2, each channel comprises a number of charge storage locations defined by an associated electrode structure 3 (not shown in FIG. 1), overlying an insulating layer 2 formed on the substrate 4. With appropriately differing potentials applied to the electrodes of the electrode structure 3 the maximum potential in the substrate, as indicated by line 5 in FIG. 2, varies along the length of the channel, thus defining potential wells 7 under some of the electrodes 3, e.g. with a three phase electrode structure, under every third electrode 3, as shown in FIG. 1. In these potential wells 7 any electric charge of appropriate polarity which is present will accumulate. By appropriately cycling the potentials applied to the electrodes 3, the potential wells 7, and hence any charge therein, may be transferred along the channel.

One half of the array (the upper half in FIG. 1) is open to light and forms an image section 9 of the array 1. The other half of the array 1 is shielded from light and forms a store section 11 of the array 1.

At the end of the store section 11 remote from the image section 9 there is a read-out section 13 of the sensor constituted by a further charge storage and transfer channel extending transverse to the channels of the store section 11. An amplifier 15 amplifies the electrical output signal of the read-out section 13.

In operation of the sensor an optical image to be converted into an electrical signal is focussed onto the image section 9. The incident light causes electric charges to be generated and stored in the image section 9 in a pattern corresponding to the image. This charge pattern is then quickly transferred to the store section 11, as indicated by the arrow 17 in FIG. 1. Whilst a further charge pattern collects in the image section 9, the charge pattern in the store section 11 is transferred to, and read out by the read-out section 13, line by line, to form an output electric signal representing the image. It will be appreciated that each line of the charge pattern is constituted by the charges in a different set of corresponding charge storage locations in the side by side channels.

A fundamental limitation of conventional frame transfer image sensors is that spurious charges are photogenerated in the image section of the array as the charge pattern corresponding to an image is being transferred from the image section to the store section.

For example, referring again to FIG. 1, if the image focussed on the image section 9 is a bright spot, as indicated at 19 in FIG. 1, when the charge pattern generated and stored in the image section 9 is transferred to the store section 11, the potential wells transferred through the region of bright spot 19 will pick up spurious charge (so-called frame shift smear) in direct proportion to the intensity of illumination of spot 19 and in inverse proportion to the rate of charge transfer. At the end of a first charge transfer, spurious charges will be present in the store section 11 in all the nominally empty potential wells above and in line with the position of the charges truly representing the bright spot, and will be present in the image section 9 in all the nominally empty potential walls below and in line with the position of the bright spot 19, as indicated by the dotted lines 21 in FIG. 1. At the end of the next charge transfer spurious charges will again be present in the image section 9, as at the end of the first charge transfer. However, in the store section 11 spurious charges will now be present both above and below the position 19' of the charges truly representing the bright spot, the charges above having been created during the second transfer, and those below being those created in the image section 9 during the first transfer and transferred to the store section 11 during the second charge transfer.

The net result is therefore that a spurious output signal appears for all points above and below the bright spot 19 giving in effect a vertical ghost line 23 in an image recreated from the output signals, as indicated in FIG. 3.

SUMMARY OF THE INVENTION

It is an object of the present invention to provide a frame transfer CCD image sensor wherein the above described problem of frame shift smear is avoided.

According to the present invention, there is provided a frame transfer CCD image sensor comprising: an image section comprising a photo-sensitive portion of an array of CCD channels; a store section comprising a non photo-sensitive portion of said array of CCD channels; a line read out section adjacent to the store section; a control electrode structure associated with said image, store and read-out sections; and means for applying pulses to the control electrode structure so as to transfer an image charge pattern generated in said image section along the channels into the store section, and to provide electrical signals representing charge stored in said store section by read out via said read-out section wherein: the number of charge storage locations in each channel in the store section of the array is greater than the number of charge storage locations in each channel in the image section of the array; said means for applying pulses applies to the electrode structure a sequence of pulses such that after each transfer of an image charge pattern generated in the image section to the store section at least one line of charge storage locations in the store section between the image section and the charge pattern transferred to the store section contains charge resulting only from frame shift smear and is otherwise substantially empty of charge; and means is provided for subtracting electrical signals representing the charges in said at least one line of charge storage locations from electrical signals read out from the store section via said read-out section, representing a said image charge pattern generated in said image section, thereby to cancel frame shift smear in said signals representing said image charge pattern.

DETAILED DESCRIPTION OF THE PREFERRED EMBODIMENTS

Figure 4:
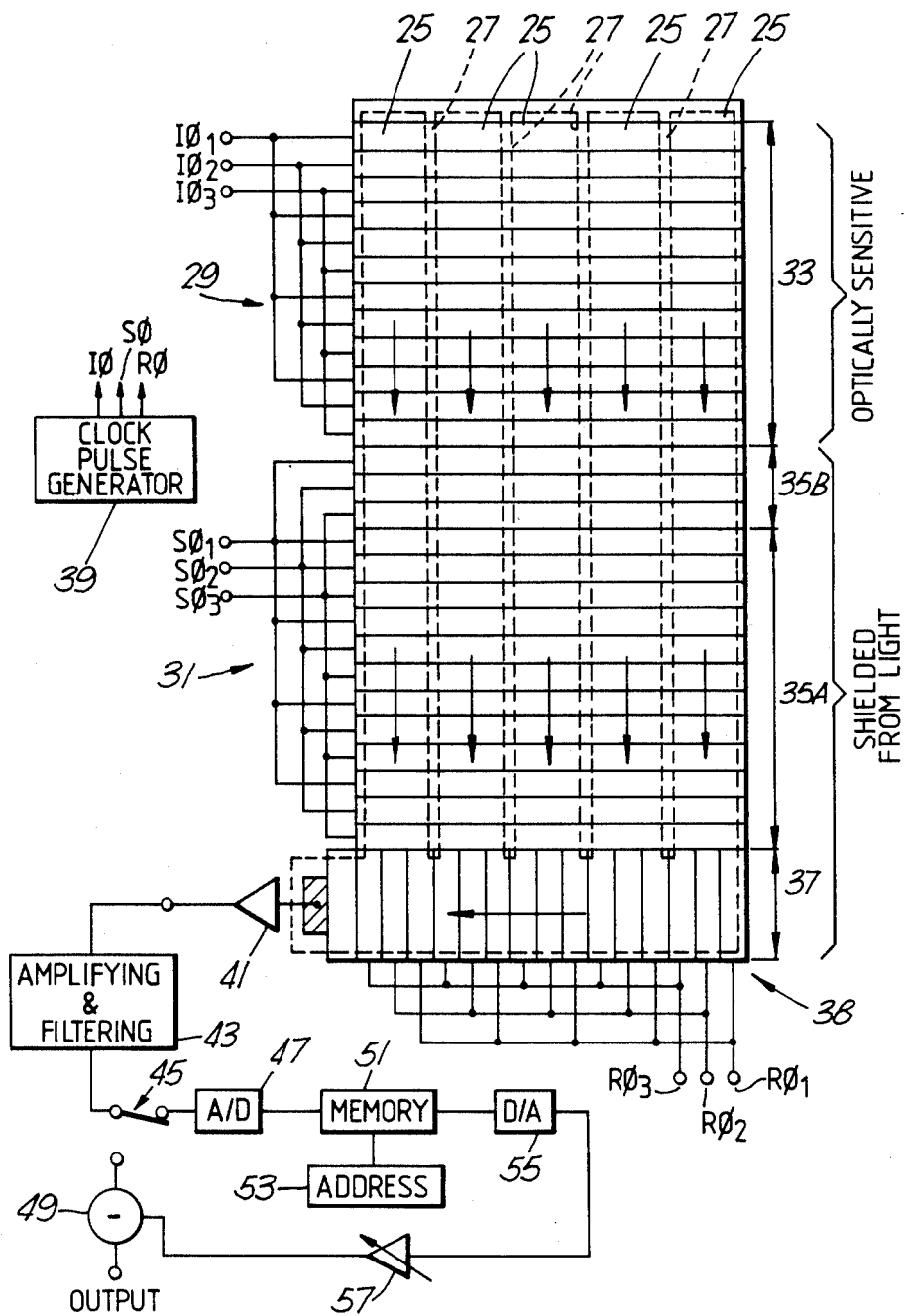
FIG. 4 illustrates the sensor in accordance with the invention.

Referring to FIG. 4, the sensor includes an array of electric charge storage and transfer channels 25 arranged side by side. In FIG. 4 only five such channels 25 are shown for clarity. The array is fabricated in known manner on a silicon substrate, adjacent channels being isolated from each other by channel stop regions in the substrate, represented by dotted lines 27 in FIG. 4. Charge storage locations within each channel 25 are defined by a three-phase electrode structure 29, 31 corresponding storage locations within the different channels being aligned to form a rectangular array of charge storage locations. One part of the array, the upper part in FIG. 4, is open to incoming light, and forms the image section 33 of the sensor, whilst the other part of the array, the lower part in FIG. 4, is shielded from the light, and forms the store section 35A, B of the sensor. At one end of the store section 35A, B the lower end in FIG. 4, there is a line read-out section 37, constituted by a further charge storage and transfer channel extending transverse to the channels 25 of the store section (35A, B) and including a three phase electrode structure 38. The sensor also includes clock pulse generating circuits 39 effective to apply clock pulses to the electrode structures of the image, store and read-out sections.

It will be appreciated that each storage location is defined by three adjacent electrodes of the associated three-phase electrode structure 29, 31 or 38, and that in FIG. 4 a small number of electrodes only is shown for the sake of clarity.

In accordance with the invention, the number of charge storage locations in each channel 25 in the store section 35A, B of the array is greater than the number in each channel 25 in the image section 33 of the array. In FIG. 4, for clarity, the store section 33 is shown as having only three electrodes 31 more, i.e. one charge storage location more, in each channel 25 than the image section 33. The store section 35 preferably has several, e.g. ten, more charge storage locations in each channel 25 than the image section 33, as further explained below.

Referring again to FIG. 4, the signal appearing at the output of the read-out section 37, after amplification in an amplifier 41, is fed via a combined amplifying and low pass filtering stage 43 to a two-way switch 45. The switch 45 serves to apply the output of the stage 43 either to an analogue-to-digital converter 47 or to a subtraction circuit 49, the switch 45 being operated, as hereafter described, under the control of pulses derived from the clock pulse generating circuits 39.

The output of the A/D converter 47 is supplied to a digital memory 51 under the control of an associated address circuit 53, which also controls the read-out and supply to a digital-to-analogue converter 55 of signals stored in the memory 51. The output of the D/A converter 55 is fed via a variable gain amplifier 57 to the subtraction circuit 49 from which the output of the sensor is derived.

Figure 1:
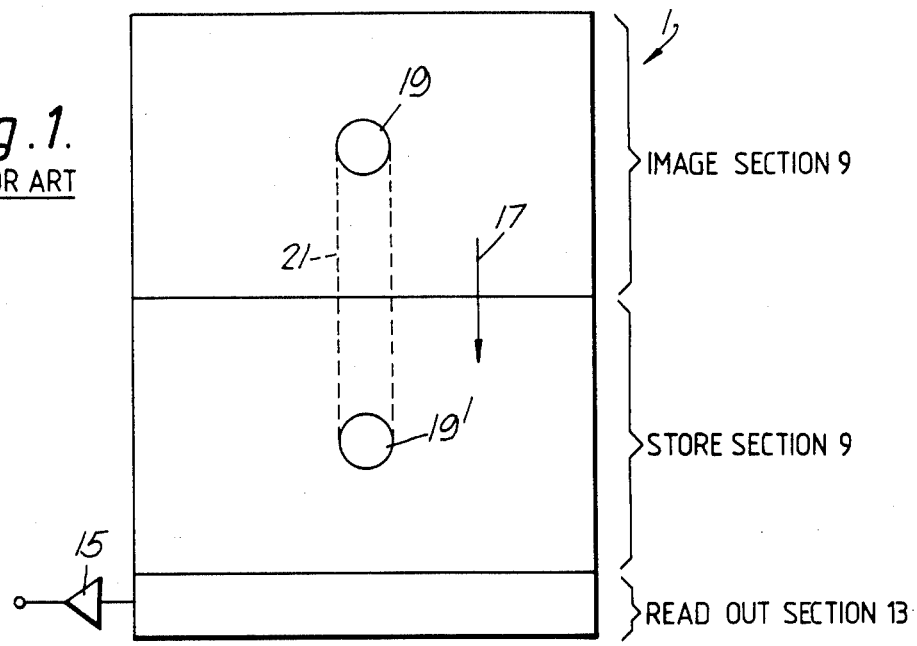
FIGS. 1-3 illustrate the sensor in accordance with the prior art.
Figure 2:
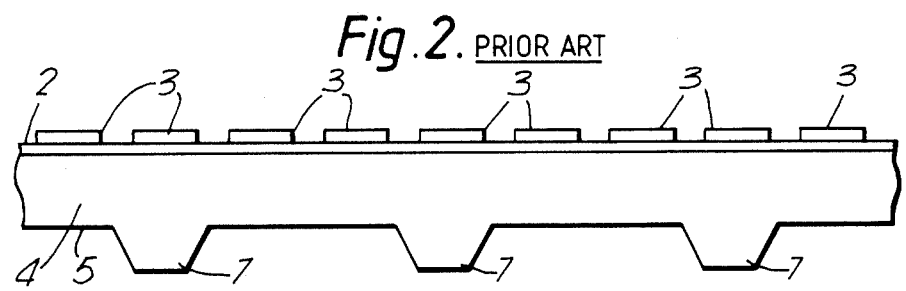
Figure 3:
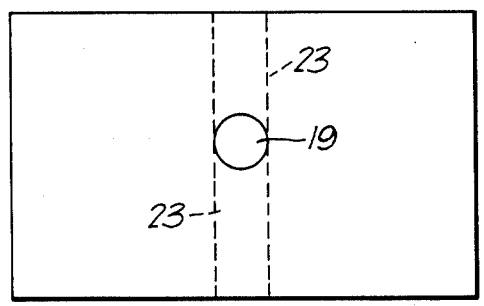

In operation, an optical iamge is focussed onto the iamge section 33 of the array, and a charge pattern corresponding to the image stored in the image section 33, as described above with reference to FIGS. 1 and 2.

By application of clock pulses $I\phi_1, I\phi_2, I\phi_3$ to the electrode structure 29 of the image section 33 and clock pulses $S\phi_1, S\phi_2, S\phi_3$ to the electrode structure 31 of the store section 35A, B, the stored charge pattern is then quickly transferred to the store section 35A, B, the pattern occupying that part 35A of the store section nearer the read-out section 37 so that the remaining part 35B of the store section adjacent the image section 33, which comprises the extra charge storage locations in the store section over and above those in the image section 33, is free of charges corresponding to the image. It will be appreciated that the part 35A of the store section containing the image charge pattern will also contain charges produced by frame shift smear whilst the other part 35B of the store section will contain charges produced by frame shift smear only.

Whilst a further image charge pattern collects in the image section 33, by application of clock pulses $S\phi_1, S\phi_2$ and $S\phi_3$ to the electrode structure 31 of the store section 35A, B and clock pulses $R\phi_1, R\phi_2$ and $R\phi_3$ to the electrode structure of the read-out section 37, the image charge pattern stored in the part 35A of the store section is transferred to and read out by the read-out section 37, line by line, to form a serial output electrical signal representing the stored charge pattern.

During the time the image charge pattern is being read out the switch 45 is operated so that the electrical output signal passes via the subtraction circuit 49 to the output of the sensor.

Immediately after all the image charge pattern has been read out, the switch 45 is operated so that the output of the read-out section 37 is passed via the A/D converter 47 to the memory 51. During this time the charges in each line of the frame-shift-smear-only charge pattern originally stored in the part 35B of the store section are allowed to accumulate in the read-out section 37, and a serial single line output signal representing the sum of the charges in these lines is passed to and stored in the memory 51 in digital form.

After the next frame transfer operation this single line signal is read out from the memory 51 during each line of the image charge pattern signal read out from the sensor read-out section 37 and passed via the D/A converter 55 and the amplifier 57 to the subtraction circuit 49 where it is subtracted from each line of the signal representing the image charge pattern. Hence, with the gain of the amplifier 57 appropriately set, a serial image pattern signal free of frame shift smear appears at the output of the sensor.

It will be appreciated that by accumulating the charges in all the lines of the frame-shift-smear-only charge pattern in the read-out section 37 to obtain a single line signal representing frame shift smear, the effect of spurious charge signals e.g. due to random noise in the amplifier, is reduced.

It will be understood in this connection that the choice of the number of extra lines, i.e. charge storage locations per channel, in the store section 35A, B over and above those in the image section 33 is thus a compromise between the desirability of averaging a number of such lines and the complexity and cost of the sensor and the time available for frame transfer. It will also normally be preferable to have a few lines in the store section 35A, B immediately adjacent the image section 33 whose signals are not used in the averaging process to facilitate light shielding of the edge of the store section 35A, B adjacent the image section 33, especially when the image has a bright region at or near its bottom edge.

In a modification of the sensor described above, instead of performing averaging in the read-out section 37, all the lines containing frame shift smear charges only may be read out in turn by the read-out section 37 and passed to and stored in the memory 51, and the averaging performed by data processing circuity (not shown) using the signals stored in the memory 51.

What is claimed is:

1. A frame transfer CCD image sensor comprising: an image section comprising a photo-sensitive portion of an array of CCD channels; a store section comprising a non-photo-sensitive portion of said array of CCD channels; a line read-out section adjacent to the store section; a control electrode structure associated with said image, store and read-out sections; and means for applying pulses to the control electrode structure so as to transfer an image charge pattern generated in said image section along the channels into the store section, and to provide electrical signals representing charge stored in said store section by read-out via said read-out section wherein: the store section of the array has several more charge storage locations in each channel than the image sections of the array; said means for applying pulses applies to the electrode structure a sequence of pulses such that after each transfer of an image charge pattern generated in the image section to the store section several lines of charge storage locations in the store section are left between the image section and the charge pattern transferred to the store section which contain charge resulting only from frame shift smear and are otherwise substantially empty of charge; and means is provided for subtracting electrical signals representing an average of the charges in said several lines of charge storage locations from electrical signals read out from the store section via said read-out section, representing a said image charge pattern generated in said image section, thereby to cancel frame shift smear in said signals representing said image charge pattern, said charges in said several lines being accumulated in the read-out section of the sensor to obtain said average.

2. A sensor according to claim 1 wherein said means for subtracting comprises: memory means for storing electrical signals representing the average of the charges in said several lines upon read-out from said store section via said read-out section; and means for subtracting said stored electrical signals from electrical signals subsequently read out from said store section via said read-out section representing a said image charge pattern generated in said image section.

3. A sensor according to claim 2 wherein said memory means stores said electrical signals representing the average of the charges in said several lines in digital form.

* * * * *